United States Patent [19]
Otaka

[11] Patent Number: 6,100,731
[45] Date of Patent: Aug. 8, 2000

[54] FREQUENCY MULTIPLIER

[75] Inventor: Shoji Otaka, Yokohama, Japan

[73] Assignee: Kabushiki Kaisha Toshiba, Kawasaki, Japan

[21] Appl. No.: 09/153,296

[22] Filed: Sep. 15, 1998

[30] Foreign Application Priority Data

Sep. 17, 1997 [JP] Japan .................................. 9-251961

[51] Int. Cl.$^7$ .................................................. H03B 19/00
[52] U.S. Cl. .......................................... 327/119; 327/122
[58] Field of Search .................................. 327/116, 119, 327/122

[56] References Cited

U.S. PATENT DOCUMENTS

| | | | |
|---|---|---|---|
| 3,544,886 | 12/1970 | Hou | 323/75 |
| 4,691,170 | 9/1987 | Riley | 328/20 |
| 5,043,654 | 8/1991 | Philipe | 323/219 |
| 5,736,840 | 4/1998 | Otaka et al. | 323/217 |

*Primary Examiner*—Timothy P. Callahan
*Assistant Examiner*—Cassandra Cox
*Attorney, Agent, or Firm*—Oblon, Spivak, McClelland, Maier & Neustadt, P.C.

[57] ABSTRACT

A frequency multiplier comprises a phase shifter having a differentiator and an integrator each including a series circuit of a resistor and a capacitor, a frequency converter for performing a frequency conversion on the basis of the output signal from the phase shifter and a drive circuit for current-driving the phase shifter in accordance with an input voltage signal.

17 Claims, 6 Drawing Sheets

FREQUENCY MULTIPLIER

BACKGROUND OF THE INVENTION

1. Field of the Invention

This invention relates to a frequency multiplier comprising a phase shifter arranged on a pre-stage of a frequency converter.

2. Discussion of the Background

Recently, mobile communications devices such as cellular phones are developed. These devices are directed to be compact and miniaturized so as to be able to be carried personally or mounted on automobiles and the like. For this purpose, it is required to use for parts of such devices monolithically integrated parts that are compact and lightweight in comparison with hybridization parts. ICs used in such devices are required to operate at a low voltage and a low power consumption rate because cellular phones are mostly driven by batteries.

The radio unit of a mobile communications device has a functional feature of converting the frequency of a base band signal to be conveyed to the receiver to that of an RF signal to be transmitted from or received by an antenna. Generally, the frequency conversion between a base band signal and an RF signal is performed by way of an intermediate frequency stage. The superheterodyne scheme is a typical technique used for the frequency conversion. The superheterodyne scheme involves the use of a local signal having a frequency different from that of the RF signal to effectively eliminate interference between the RF signal and the local signal and provide excellent operating characteristics. The scheme has an additional advantage of providing a favorable spurious characteristic if a filter is used for the intermediate frequency stage and hence is popularly used in commercially available radio sets.

On the other hand, a direct conversion scheme of performing the frequency conversion between a base band signal and an RF signal without using an intermediate frequency stage is also known. The direct conversion scheme involves more factors contributing to degradation in the performance of the radio unit than the superheterodyne scheme. However, the direct conversion scheme has an advantage that the radio unit requires a smaller number of parts than the radio unit based on the superheterodyne scheme and hence is less costly. Research and development efforts have been paid to exploit this advantage on the part of the direct conversion scheme and devices based on this scheme are becoming commercially available.

The interference of the RF signal with the local signal has been an obstacle for the commercialization of devices based on the direct conversion scheme. Such interference occurs because the RF signal and the local signal use the same frequency. A technique has been proposed to avoid the obstacle by reducing the oscillation frequency of the local signal to a half of the frequency of the RF signal and performing a frequency conversion between the base band signal and the RF signal, using a signal having a frequency obtained by doubling that of the local signal by means of a frequency multiplier.

When carrying out a frequency conversion by means of this technique, the frequency (fc/2) of the local signal is doubled. This frequency multiplication can be performed without problem to produce a signal having the doubled frequency when the signal is of a sine wave. However, if the signal is of a rectangular wave, when two signals to be multiplied are in phase or in opposite phase to each other, the multiplication result includes only a direct current component. As a result, no properly multiplied signal is obtained. In this case, 90° phase-shifter is required for obtaining high output with frequency of fc. However, the conventional voltage-driven 90° phase-shifter with a RC/CR circuit has a large phase-error when a rectangular signal is input to the phase-shifter. Conventionally, the waveform of the current input to the phase shifter is no longer sinusoidal wave and consequently the accuracy of phase shift is degraded.

SUMMARY OF THE INVENTION

It is an object of the present invention to provide a high power frequency multiplier with a low power consumption wherein an input current having a rectangular waveform can input to a phase shifter without increasing a power consumption.

According to the invention, there is provided a frequency multiplier comprising a phase shifter having a differentiator and an integrator each including a series circuit of a resistor and a capacitor, a frequency converter for performing a frequency conversion on the basis of the output signal from the phase shifter, and a drive circuit for current-driving the phase shifter in accordance with an input voltage signal.

In other words, the present frequency multiplier has a structure wherein a phase shifter arranged on a pre-stage of a frequency conversion circuit is current-driven by a drive circuit having a high internal impedance. With this arrangement, the ratio of the current signal of the drive circuit to the input current of the phase shifter can be brought close to 1. Moreover, the phase-shifter with a CR/RC circuit performs 90° phase-shift exactly. Therefore, the phase shifter can receive a rectangular input current waveform without raising the power consumption rate and can perform a phase shift operation of a high accuracy with a low power consumption rate. A frequency multiplier according to the invention can be used for a radio circuit employing a direct conversion scheme to reduce the number of parts of the power consumption rate of the circuit.

In order to current-drive the phase shifter, the amplifier arranged on a pre-stage of the phase shifter may be constituted by an common emitter amplifier or common base amplifier or a common source amplifier or common gate amplifier including a differential amplifier.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE PREFERRED EMBODIMENTS

There will now be described a frequency multiplier relative to a first embodiment referring to FIGS. 1 and 2. The frequency multiplier is used to double the frequency fc/2 of the local signal in the radio unit of, for example, a PHS terminal. By using the output signal of the frequency fc from the frequency multiplier, the frequency conversion between the RF transmission/reception signal and the base band signal can be performed in accordance with the direct conversion scheme.

Figure 1:
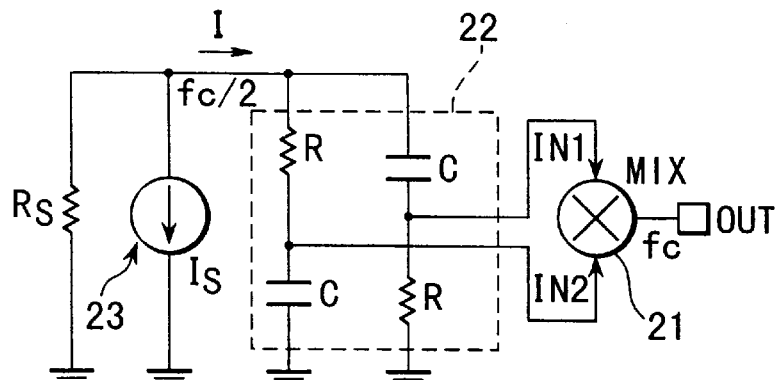
FIG. 1 is a schematic circuit diagram of a frequency multiplier of a first embodiment of according to the invention.
Figure 2:
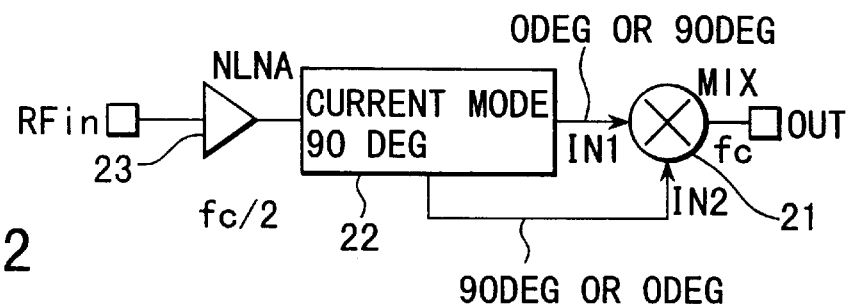
FIG. 2 is a schematic block diagram of the frequency multiplier of FIG. 1.

In the frequency multiplier as shown in FIGS. 1 and 2, an analog 90° phase shifter 22 is arranged on the input stage of a multiplier 21 for frequency conversion. The analog 90° phase shifter 22 comprises an RC integrator circuit of a resistor R and a capacitor C connected directly in series and a CR differentiator circuit of a capacitor C and a resistor R connected directly in series. The output of the integrator circuit and that of the differentiator circuit are input to a multiplier 21 as input signals IN1 and IN2 having voltage phases different from each other by 90°.

Referring to FIG. 1, the analog 90° phase shifter 22 is current-driven by the output current signal of a nonlinear amplifier (NLNA) 23 with a current source Is and a resistor Rs connected in parallel.

With the frequency multiplier, the analog 90° phase shifter 22 is current-driven by a current drive circuit (nonlinear amplifier) having a high internal impedance by setting the resistor Rs to a large resistance, for example, between 100 and 200 ohms. The ratio of the current signal Is to the current I supplied to the phase shifter 22 is brought close to 1 by setting the resistance of the resistor Rs to a large value. In other words, the current signal Is is almost entirely supplied to the phase shifter 22. Thus, a large input current I can be provided without using a high voltage, so that a current signal having a rectangular waveform can be applied to the phase shifter 22 with a low power consumption being maintained.

Considering the splitting ratio of the current and the accuracy of phase shift operation, the circuit constant is set so as to satisfy the following condition:

$$Rs > |R + 1/jwC|$$

so that the absolute value of the output impedance of the current drive circuit becomes larger than the impedance (=R+1/jwC) of the phase shifter 22. As a result, the phase shifter will operate satisfactorily well for the frequency multiplier. Especially, the rectangular signal is input to the phase-shifter. In this case, since the phase shift error is about 10 degrees when the rectangular signal is input to the phase shifter, the decrease of the desired doubling frequency component (fcHz) can be neglected.

With the frequency multiplier according to the invention and having a configuration as described above, the current signal can be effectively applied to the phase shifter 22 from the nonlinear amplifier (NLNA) 23 by driving the phase shifter 22 including a differentiator and an integrator by means of the nonlinear amplifier (NLNA) 23 having a high output impedance. Thus, an input current having a rectangular waveform can successfully be applied to the phase shifter 22 without increasing the power consumption to accurately carry out a phase shift, maintaining a low power consumption.

Figure 3:
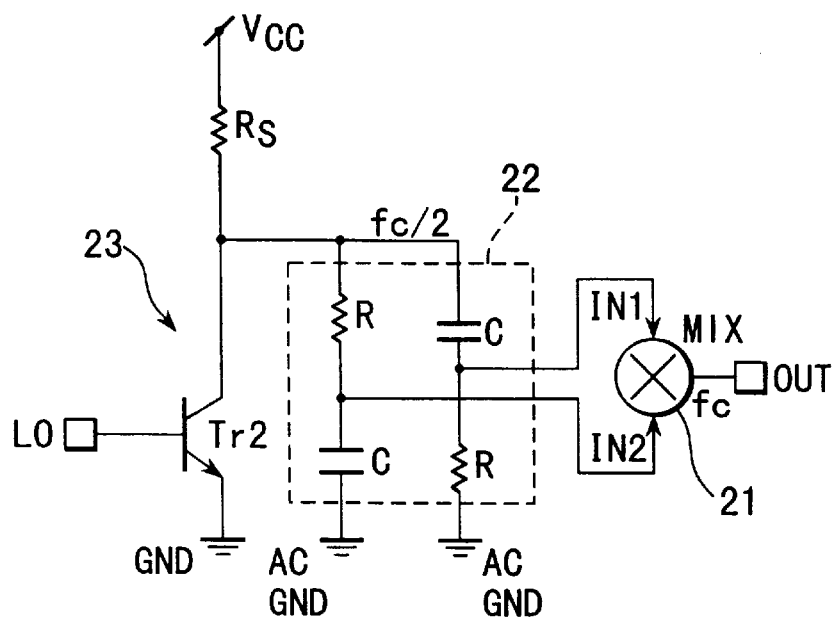
FIG. 3 is a schematic circuit diagram of a frequency multiplier of a second embodiment according to the invention.

According to a frequency multiplier of the second embodiment as shown in FIG. 3, the phase shifter 22 is current-driven by a common emitter amplifier 23 comprising a common emitter transistor Tr2 and a load resistor Rs connected between the collector of the transistor Tr2 and the power source $V_{CC}$.

A local voltage signal (LO) is applied to the base of the common emitter transistor Tr2 and a voltage/current converted nonlinear current signal is output from the collector terminal of the common emitter transistor Tr2. As shown in FIG. 3, since the RC series circuit of the integrator and that of the differentiator are connected between the AC ground and the collector terminal of the common emitter transistor Tr2, the load resistor Rs and these RC series circuits are connected in parallel in a AC mode. Thus, the frequency multiplier is indicated by the equivalent circuit of FIG. 1. In other words, the current signal obtained from the collector terminal of the common emitter transistor Tr2 is divided into the resistor Rs and the phase shifter 22 in accordance with the ratio of the resistance of the load resistor Rs to the impedance of the phase shifter 22. Therefore, the larger the load resistor Rs is, the larger the current fed to the phase shifter 22 becomes.

The frequency multiplier of this embodiment outputs not only a component of a desired frequency ωc (=2πfc) but also a frequency component equal to a frequency obtained by an integral multiple of a frequency ωc/2. However, the undesired frequency component can be removed by a filter arranged on a rear stage of the frequency multiplier.

Figure 4:
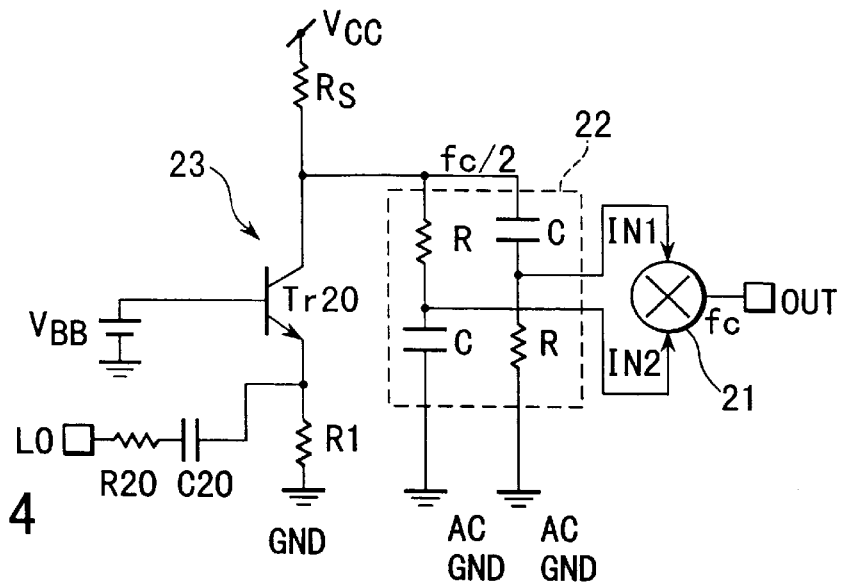
FIG. 4 is a schematic circuit diagram of a frequency multiplier of a third embodiment according to the invention.

FIG. 4 shows a frequency multiplier of the third embodiment. The frequency multiplier is identical with that of FIG. 3 except that the common emitter amplifier thereof is replaced by a common base amplifier.

Referring to FIG. 4, a resistor Rs, a common base transistor Tr20 and a resistor R1 are connected in series between the positive power source terminal $V_{CC}$ and the ground terminal. A predetermined DC bias voltage is applied to the base of the common base transistor Tr20 and a local voltage signal (LO) is applied to the node of the emitter and the resistor R1 by way of a resistor R20 and a capacitor C20. With this arrangement again, a voltage/current converted nonlinear current signal is output from the collector terminal of the common base transistor Tr20 and current-drives the phase shifter 22. Accordingly, the multiplier 21 arranged on a pre-stage of the phase shifter 22 performs accurately a frequency conversion of a rectangular waveform.

Figure 5:
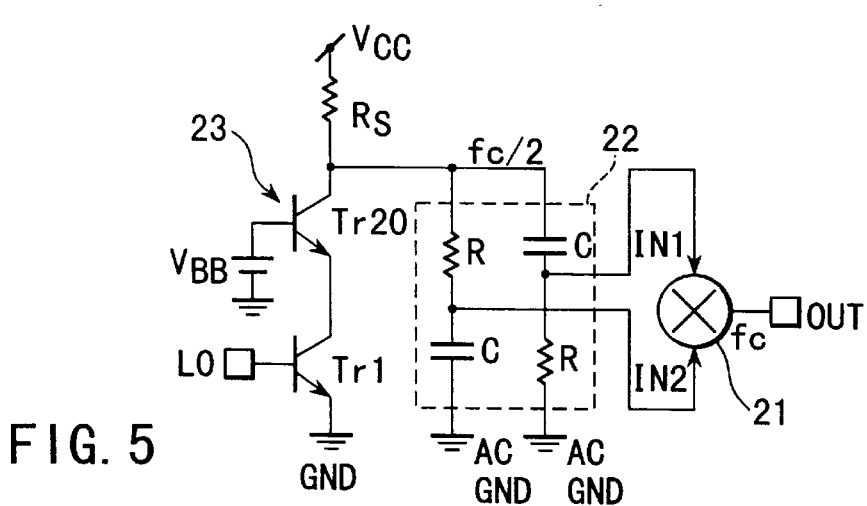
FIG. 5 is a schematic circuit diagram of a frequency multiplier of a fourth embodiment according to the invention.

FIG. 5 shows a frequency multiplier of the fourth embodiment.

In this embodiment, a load resistor Rs, a common base transistor Tr20 and a common emitter transistor Tr1 are connected in series between the positive power source terminal $V_{CC}$ and the ground terminal. A local voltage signal (LO) is applied to the base of the common emitter transistor Tr1 and a voltage/current converted nonlinear current signal is output from the collector terminal of the common base transistor Tr20.

With this arrangement, the frequency multiplier can set the internal impedance to a sufficiently large value in comparison with the common emitter transistor of FIG. 4, resulting in realizing excellent conversion characteristics.

There will now be a fifth embodiment closely related to the frequency multiplier shown in FIGS. 1 and 2. In this embodiment, a common emitter transistor of FIG. 3 is used as input stage amplifier 23.

Figure 6:
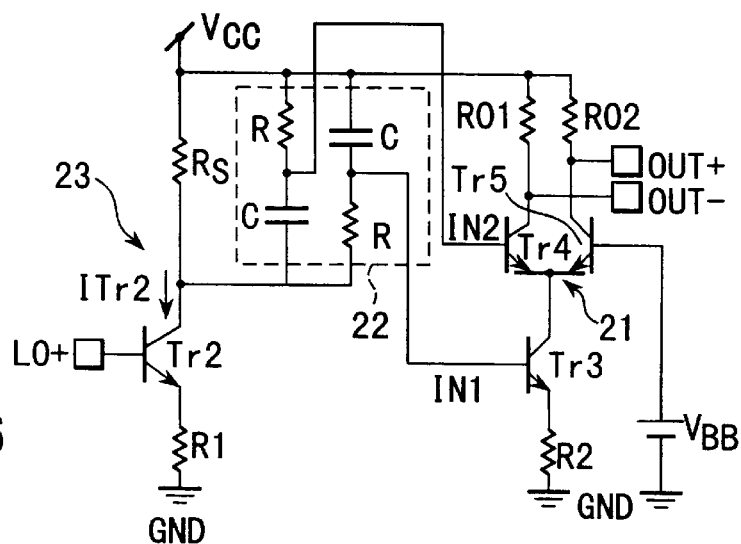
FIG. 6 is a schematic circuit diagram of a frequency multiplier of a fifth embodiment of according to the invention.

According to the frequency multiplier of the fifth embodiment of FIG. 6, the multiplier 21 comprises a single balanced mixer (SBM) using a differential circuit. More specifically, this SBM comprises a pair of differential transistors Tr4 and Tr5 whose emitters are connected to each other, load resistors R01 and R02, a transistor Tr3 connected in series between the emitters of a pair of differential transistors Tr4 and Tr5 and a resistor R2 which is grounded at the other port.

The integrator output IN1 of the current-drive type phase shifter 22 is applied to the base of the transistor Tr3 and the differential output IN2 of the current-drive type phase shifter 22 is applied to the base of the transistor Tr4 while a bias voltage $V_{BB}$ is applied to the base of the transistor Tr5.

The above circuit has an additional feature that the differential and integral outputs of the current-drive type phase shifter 22 differ in DC to each other, so that they are used for setting a DC bias voltage for the SBM. More specifically, the DC voltage of the differential output IN2 is equal to the positive power source voltage $V_{CC}$ and used as DC bias voltage of the transistor Tr4. If the DC current flowing through the transistor Tr2 is ITr2, the base voltage of the transistor Tr3 is expressed by VCC-Rs·Itr2 if the base current is negligible, and this voltage is applied to the base of the transistor Tr3 by the integral output IN1.

As described above, the DC output of the differentiator is set to a positive voltage source and that of the integral output is set to a lower value than the differential output. These DC voltages are used for setting DC bias voltage. As a result, the DC bias circuit for SBM, that is, respective bias circuits for the transistors Tr3 and Tr4 are not required. Therefore, a low power consumption can be attained.

To the base of the transistor Tr5 may be applied an additional voltage source $V_{BB}$. However, even if the voltage source $V_{CC}$ is applied to the base of the transistor TR5, the frequency multiplier can operate because the $V_{CC}$ is applied to the base of the transistor Tr4 via the resistor R of the phase shifter 22.

The resistor R1 connected to the emitter of the transistor Tr2 is a linear resistor. However, this resistor is not necessarily required.

Figure 7:
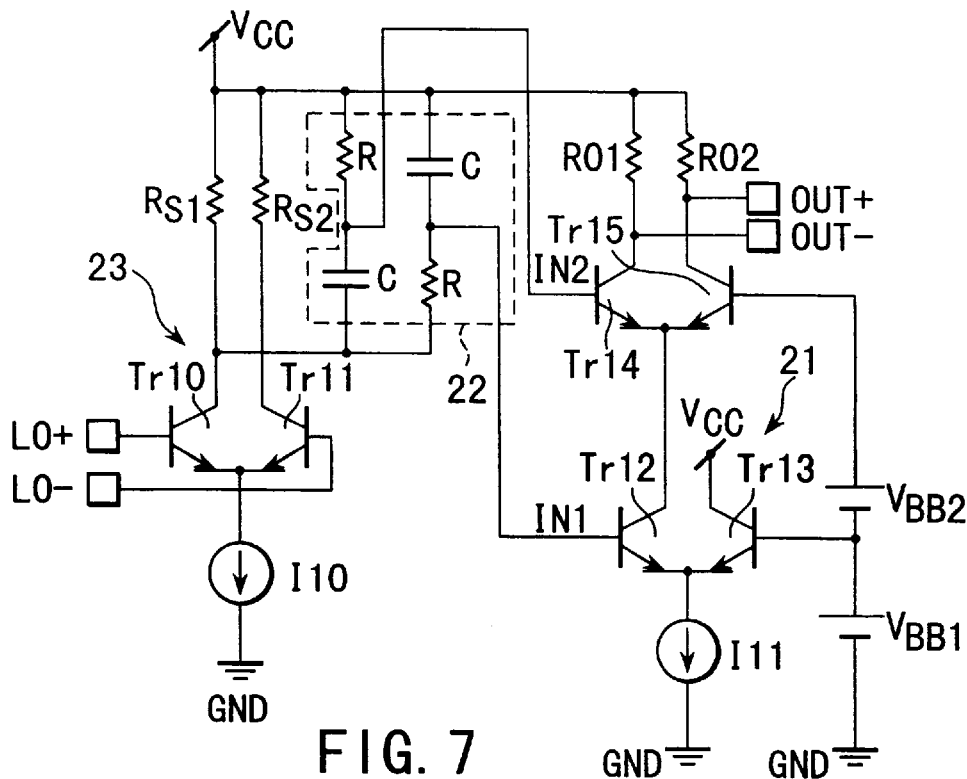
FIG. 7 is a schematic circuit diagram of a frequency multiplier of a sixth embodiment according to the invention.

FIG. 7 shows a frequency multiplier of the sixth embodiment wherein the input stage amplifier 23 is a common emitter differential amplifier and the multiplier 21 comprises two pairs of differential transistors arranged in two stages.

As shown, the input stage amplifier 23 comprises a pair of differential transistors Tr10, Tr11 whose emitters are connected to each other, load resistors Rs1, Rs2 and a current source I10 connected between the emitters of the differential transistors Tr10, Tr11 and the ground.

With the above arrangement, since the current from the current source I10 is switched by the pair of differential transistors Tr10, Tr11 to the resistors Rs1 and Rs2, the current output of the amplifier 23 shows a rectangular waveform that is ideally expressed by the following equation:

$$I(t)=\sin \omega_{c/2} \cdot t + (1/3)A\sin 3 \cdot \omega_{c/2} \cdot t + (1/5)\sin 5 \cdot \omega_{c/2} \cdot t + \ldots$$

where $\omega_{c/2}$: fundamental angular frequency

At the multiplier 21, a pair of differential transistors Tr12, Tr13 are arranged on a lower stage of another pair of differential transistors Tr14, Tr15 and the emitters of the differential transistors Tr12, Tr13 are connected to the current source I11. With this arrangement, since the current from the current source I11 is switched by the differential transistor pair Tr12, Tr13, a half of the current flowing to the current source I11 can be used as a signal, resulting in reducing the power consumption rate of the multiplier 21.

In FIG. 7 again, the DC voltage of the integral output is used as DC bias voltage for the transistor Tr12 whereas the DC voltage of the differential output is used as DC bias voltage for the transistor Tr14.

Figure 8:
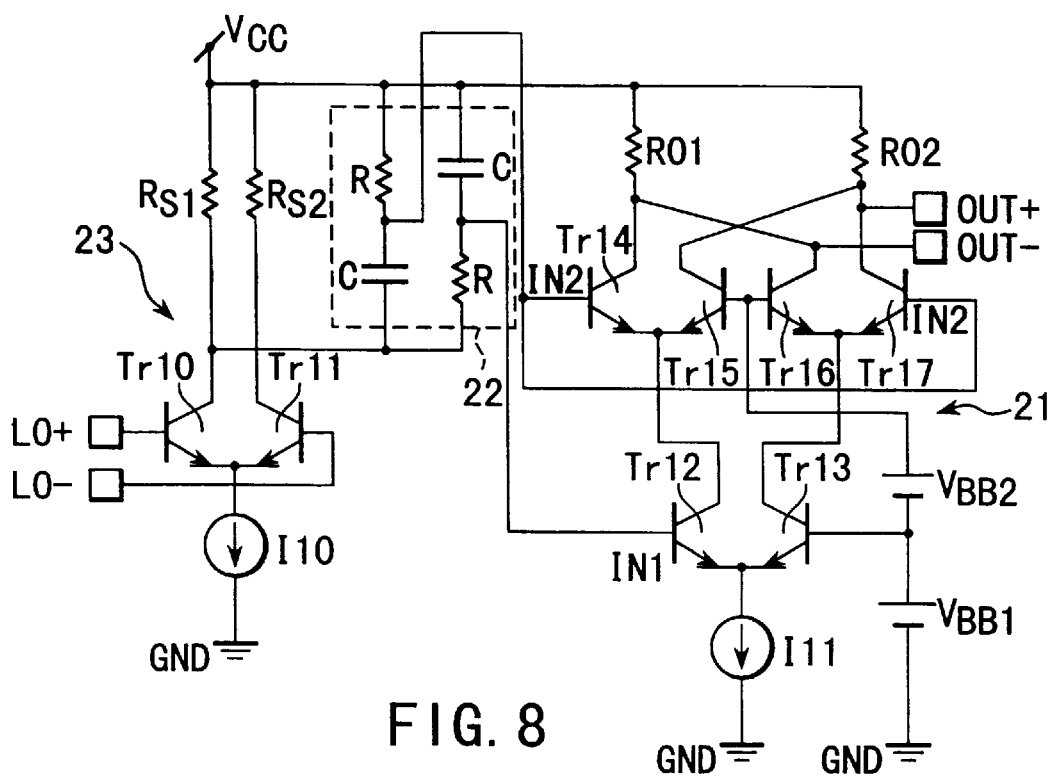
FIG. 8 is a schematic circuit diagram of a frequency multiplier of a seventh embodiment according to the invention.

A frequency multiplier of the seventh embodiment shown in FIG. 8 improves that of FIG. 7.

Referring to FIG. 8, at the multiplier 23, a pair of differential transistors Tr16, Tr17 are additionally provided and connected in parallel with a pair of differential transistors Tr14, Tr15 and the emitters of the differential transistors Tr16, Tr17 are connected to the collector of one transistor Tr13 of the lower stage transistors Tr12, Tr13. With this arrangement, the multiplier 21 operates as a double balanced mixer (DBM).

Additionally, the current flowing to the transistor Tr13 can be taken out as a signal by the pair of transistors Tr16, Tr17 without discarding it unlike the case of FIG. 7. In other words, the arrangement of FIG. 8 can produce an output twice as powerful as that of the arrangement of FIG. 7 to further reduce the power consumption rate.

Figure 9:
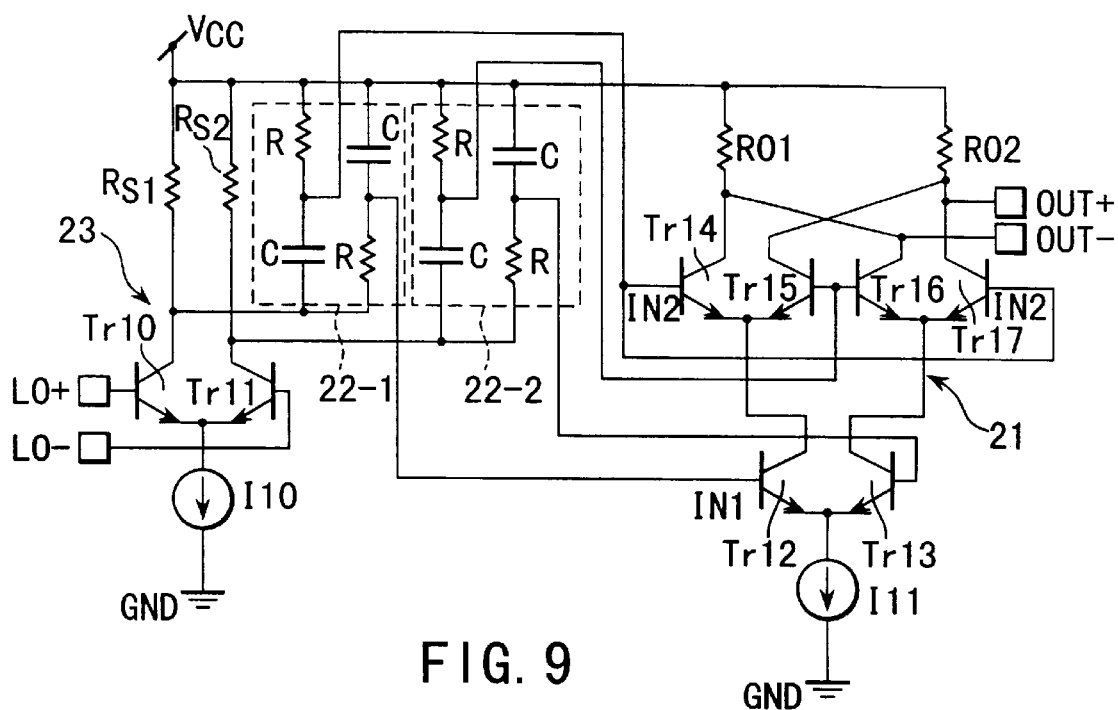
FIG. 9 is a schematic circuit diagram of a frequency multiplier of a n eighth embodiment according to the invention.

FIG. 9 shows a frequency multiplier of the eighth embodiment which is obtained by further improving that of FIG. 8.

The embodiment of FIG. 9 comprises two phase shifters 22-1, 22-2, of which the phase shifter 22-1 is driven by the electric current flowing on the side of the transistor Tr10 of the pair of differential transistors Tr10, Tr11 of the input stage amplifier 23 whereas the phase shifter 22-2 is driven by the current flowing on the side of the transistor Tr11. The integral output of the phase shifter 22-1 and that of the phase shifter 22-2 are input respectively to the bases of the differential transistors Tr12, Tr13 of the multiplier 21. The differential output of the phase shifter 22-1 is input to the base of the transistor Tr14 of the differential transistors Tr14, Tr15 and that of the transistor Tr17 of the differential transistors Tr16, Tr17 of the multiplier 21 whereas the differential output of the phase shifter 22-2 is input to the base of the transistor Tr15 of the differential transistors Tr14, Tr15 and that of the transistor Tr16 of the differential transistors Tr16, Tr17 of the multiplier 21. The base of the transistor Tr13 is driven by the output of the integrator of the phase shifter 22-2.

Thus, the gain of the input stage amplifier 23 can be doubled by arranging another phase shifters for the differential transistors Tr10, Tr11 of the input stage amplifier 23.

Figure 10:
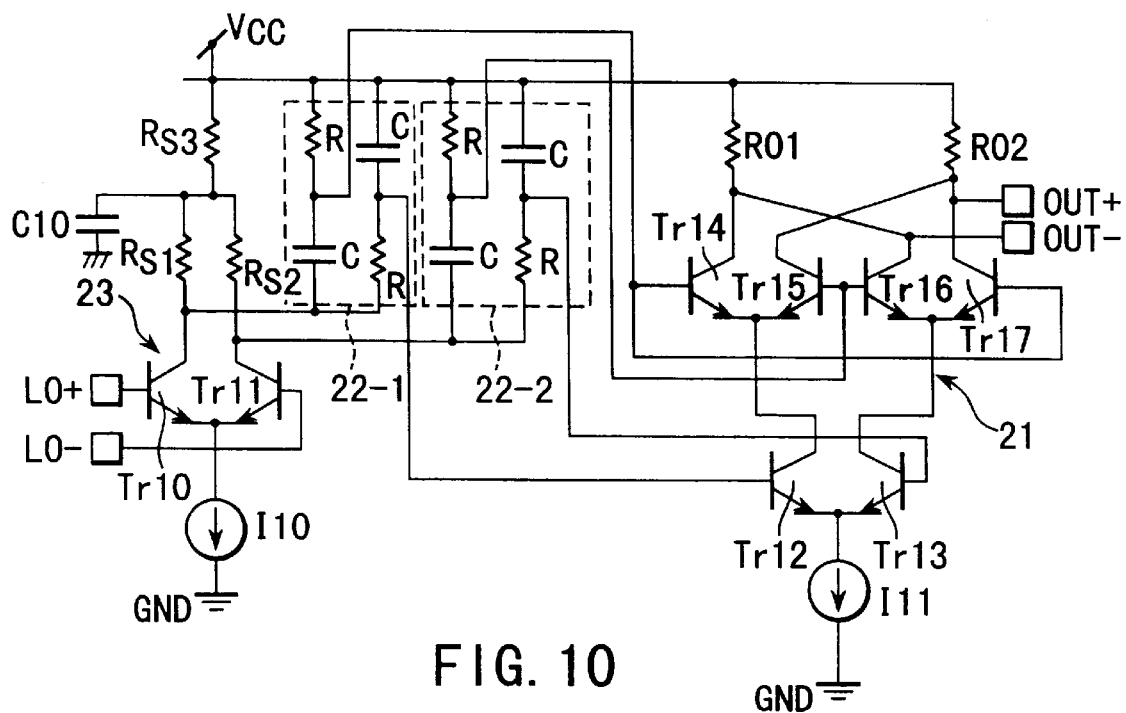
FIG. 10 is a schematic circuit diagram of a frequency multiplier of a ninth embodiment according to the invention.

FIG. 10 shows a frequency multiplier of the eighth embodiment which is obtained by further improving that of FIG. 9.

In this embodiment, a resistor Rs3 is additionally arranged between the load resistors Rs1, Rs2 and the power source terminal $V_{CC}$ of the input stage amplifier 23. Still additionally, a capacitor C10 is connected between the node of the resistors Rs1, Rs2 and the resistor Rs3 and the AC ground terminal. The capacitor C10 and the resistor Rs3 operates as low-pass filter. With this arrangement, any unnecessary wave coming from the power source can be removed to drive the circuit stably.

Although bipolar transistors are used in the above embodiments, they may be replaced by MOSFETs or MESFETs.

Figure 11:
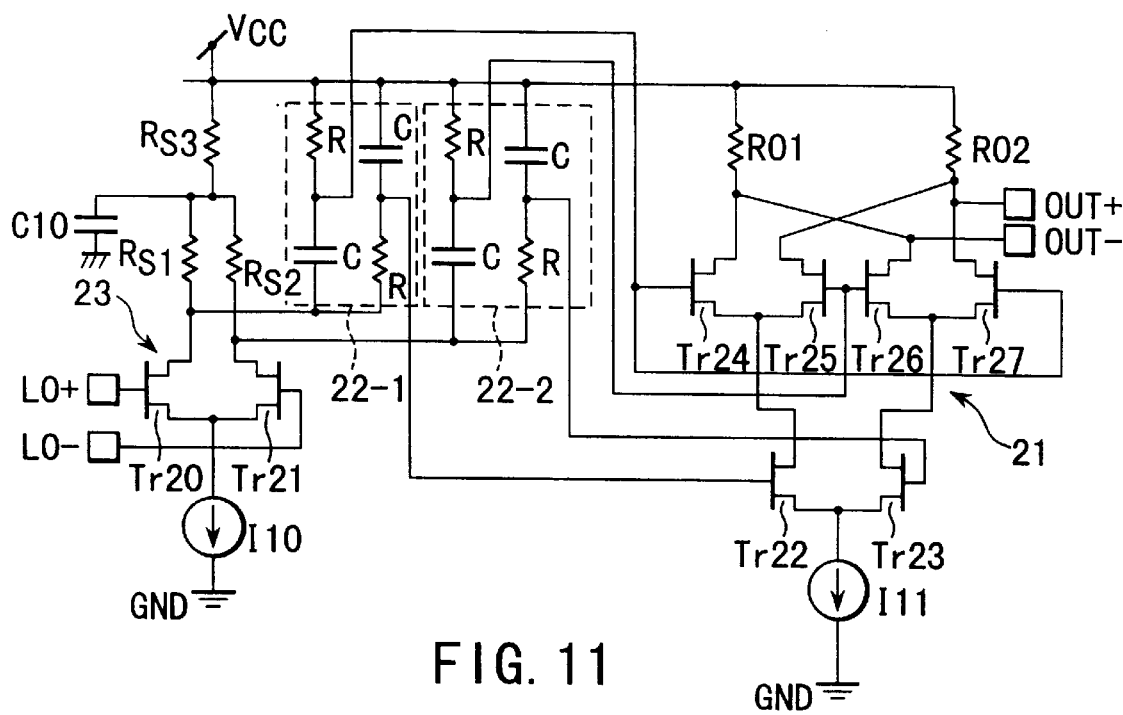
FIG. 11 is a schematic circuit diagram of a frequency multiplier of a tenth embodiment according to the invention.

For example, as shown in FIG. 11, the bipolar transistors Tr10 through Tr17 used in the frequency multiplier of FIG. 10 may be replaced by MOSFETs or MESFETs Tr20 through Tr27. With this arrangement, the common emitter transistors and the common base transistors of FIG. 10 operate respectively as common source transistors and common gate transistors. The drains of the common source transistors and those of the common gate transistors are used as output terminals for current-driving the phase shifters.

Now, a radio unit to which a frequency multiplier according to the invention is applied will be described by referring to FIG. 12.

Figure 12:
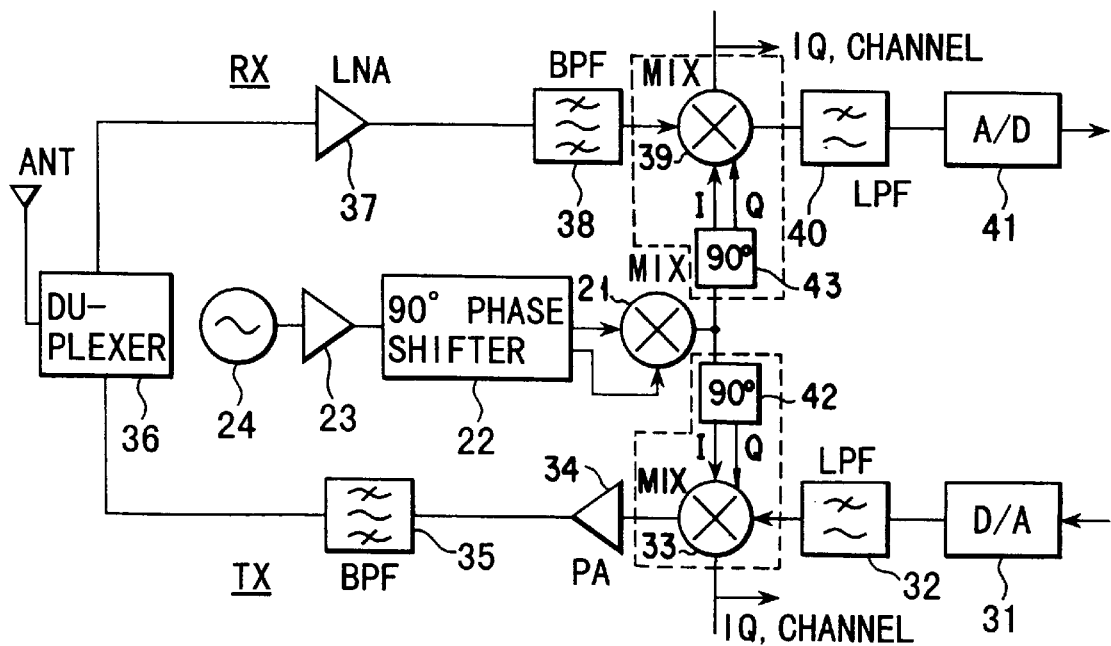
FIG. 12 is a schematic block diagram of a radio unit to which a frequency multiplier according to the invention is applied.

The radio unit of FIG. 12 includes a transmission circuit (TX) and a reception circuit (RX), which are connected to antenna ANT by way of a transmission/reception changeover switch (duplexer) 36. The transmitter circuit (TX) comprises a D/A converter 31, a low-pass filter (LPF) 32, a multiplier 33 operating as mixer (MIX), a transmission power amplifier (PA) 34 and a band-pass filter (BPF) 35, whereas the receiver circuit (RX) comprises a low noise amplifier (LNA) 37, a band-pass filter (BPF) 38, a multiplier 39 operating as mixer (MIX), a low-pass filter (LPF) 40 and an A/D converter (A/D) 41.

Figure 13:
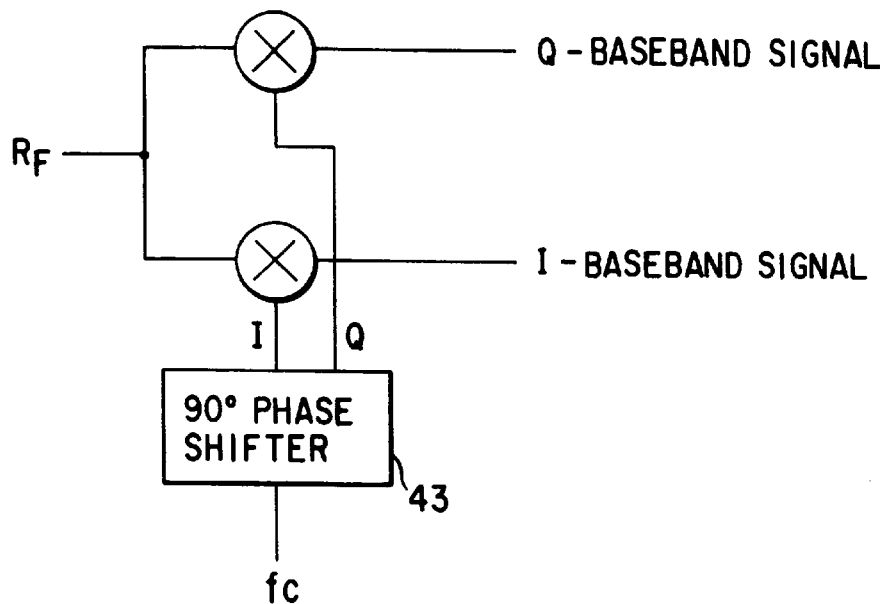
FIG. 13 is a schematic circuit diagram of a RX demodulator.
Figure 14:
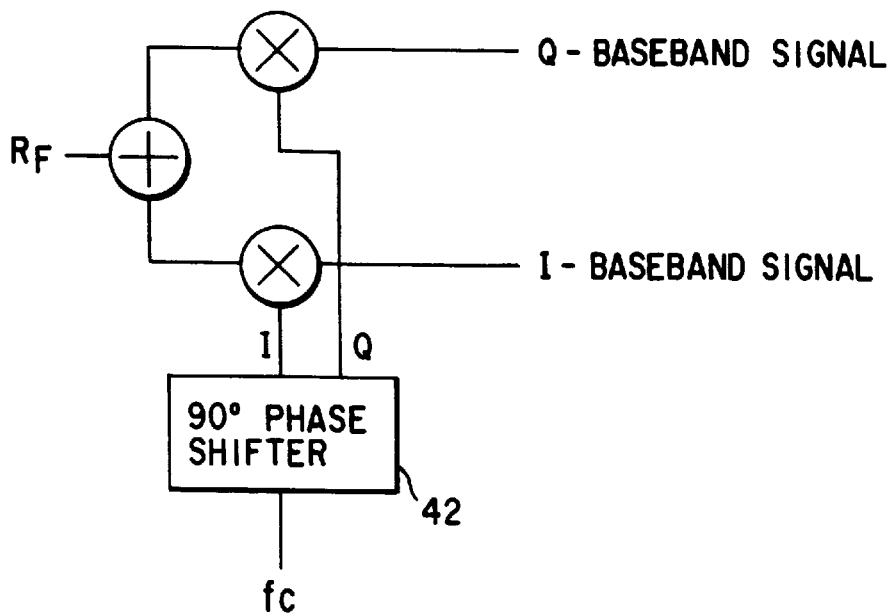
FIG. 14 is a schematic circuit diagram of a TX modulator.

The frequency multiplier comprising a multiplier 21, a phase shifter 22 and an amplifier 23 and according to the invention doubles the local signal generated by a local oscillator (LO) 24. More specifically, the local signal having a frequency of fc/2 sent out from the local oscillator (LO) 24 is amplified by the amplifier 23 and its phase is shifted by 90° by the phase shifter 22 before its frequency is doubled by the multiplier 21 that is in fact operating as frequency multiplier. The local signal having the doubled frequency of fc is then sent to the multipliers 33 and 39 via 90° phase shifters 42 and 43 for TX and RX, respectively. The fc signals carry out a frequency converting operation between an RF signal and a base band signal (I channel: in phase channel and Q channel: quadrature phase channel) by means of a direct conversion scheme and the local signal having the doubled frequency. In the above explanation, the multiplier 33 means a direct vector modulator which needs I/Q base band input signals and I/Q LO input signals, as shown in FIG. 14. The multiplier 39 means a direct vector demodulator which needs RF input signal and I/Q LO input signals and output I/Q base band signals, as shown in FIG. 13.

The output signal of the multiplier 33 is then amplified by the amplifier 34 and processed by the band-pass filter 35 before sent to the antenna ANT via the transmission/reception change-over switch 36 and transmitted from the antenna ANT. On the other hand, the output signals of the multiplier 39 are processed by the low-pass filter 40 and converted into a digital signal by means of the A/D converter 41 to make a digital reception signal.

Thus, as described above in detail, according to the invention, a current signal from an amplifier circuit can be applied to a phase shifter comprising a differentiator and an integrator by current-driving the phase shifter by means of an amplifier circuit having a high internal impedance, so that the phase of the signal can be shifted accurately at a low power consumption rate. Then, the signal can be subjected to a frequency converting operation using a rectangular waveform at the multiplier arranged on a rear stage of the phase shifter, so that the operation of doubling the frequency can be carried out without using a linear amplifier that consumes power at a high consumption rate.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A frequency multiplier comprising:
   a phase shifter having a CR differentiator and a RC integrator each fabricated by a series circuit of a resistor and a capacitor;
   a frequency converter configured to perform a frequency conversion on the basis of an output signal from said phase shifter; and
   a current drive circuit configured to supply a drive current to said phase shifter for current-driving said phase shifter in accordance with an input voltage signal.

2. A frequency multiplier according to claim 1, wherein the differentiator and integrator generate DC voltages different from each other which are used for setting a DC bias of the frequency converter.

3. A frequency multiplier according to claim 1, wherein said drive circuit has an output impedance larger than an input impedance of said phase shifter.

4. A frequency multiplier according to claim 3, wherein the differentiator and integrator generate DC voltages different from each other which are used for setting a DC bias of the frequency converter.

5. A frequency multiplier comprising:
   a phase shifter having a differentiator and an integrator each fabricated by a series circuit of a resistor and a capacitor;
   a frequency converter configured to perform a frequency conversion on the basis of an output signal from said phase shifter; and
   a drive circuit configured to current-drive said phase shifter in accordance with an input voltage signal,
   wherein said drive circuit includes one of a common emitter transistor having a base to which a local voltage signal is input from an oscillator and a common base transistor having an emitter to which the local voltage signal is input, and one of the common emitter transistor and the common base transistor having a collector ac-connected to said phase shifter for current-driving said phase shifter.

6. A frequency multiplier according to claim 5, wherein the differentiator and integrator generate DC voltages different from each other which are used for setting a DC bias of the frequency converter.

7. A frequency multiplier comprising:
   a phase shifter having a differentiator and an integrator each fabricated by a series circuit of a resistor and a capacitor;

a frequency converter configured to perform a frequency conversion on the basis of an output signal from said phase shifter; and a drive circuit configured to current-drive said phase shifter in accordance with an input voltage signal, wherein said drive circuit comprises a load resistor, a common base transistor, and a common emitter transistor having a base to which a local voltage signal is input from an oscillator, which are connected in series between a power source terminal and a ground terminal.

8. A frequency multiplier comprising:

a phase shifter having a differentiator and an integrator each fabricated by a series circuit of a resistor and a capacitor;

a frequency converter configured to perform a frequency conversion on the basis of an output signal from said phase shifter; and a drive circuit configured to current-drive said phase shifter in accordance with an input voltage signal, wherein said drive circuit includes one of a common source transistor having a gate to which a local voltage signal is input from a oscillator and a common gate transistor having a source to which the local voltage signal is input, and one of the common source transistor and the common gate transistor having a drain ac-connected to said phase shifter for current-driving said phase shifter.

9. A frequency multiplier according to claim 8, wherein the differentiator and integrator generate DC voltages different from each other which are used for setting a DC bias of the frequency converter.

10. A frequency multiplier comprising:

a phase shifter having a differentiator and an integrator each fabricated by a series circuit of a resistor and a capacitor;

a frequency converter configured to perform a frequency conversion on the basis of an output signal from said phase shifter; and a drive circuit configured to current-drive said phase shifter in accordance with an input voltage signal, wherein said frequency converter includes a multiplier comprising a single balanced mixer using a differential circuit.

11. A frequency multiplier comprising:

a phase shifter having a differentiator and an integrator each fabricated by a series circuit of a resistor and a capacitor;

a frequency converter configured to perform a frequency conversion on the basis of an output signal from said phase shifter; and a drive circuit configured to current-drive said phase shifter in accordance with an input voltage signal, wherein said drive circuit comprises a pair of differential transistors having emitters connected to each other, a pair of load resistors connected respectively to the differential transistors and a current source connected between a node of the emitters of said differential transistors and the ground.

12. A frequency multiplier comprising:

a phase shifter having a differentiator and an integrator each fabricated by a series circuit of a resistor and a capacitor;

a frequency converter configured to perform a frequency conversion on the basis of an output signal from said phase shifter; and a drive circuit configured to current-drive said phase shifter in accordance with an input voltage signal, wherein said frequency converter comprises a first pair of differential transistors, a second pair of differential transistors arranged on a lower stage of said first differential transistors and a current source connected to the emitters of said second differential transistors.

13. A frequency multiplier comprising:

a phase shifter having a differentiator and an integrator each fabricated by a series circuit of a resistor and a capacitor;

a frequency converter configured to perform a frequency conversion on the basis of an output signal from said phase shifter; and a drive circuit configured to current-drive said phase shifter in accordance with an input voltage signal, wherein said frequency converter comprises a first pair of differential transistors, a second pair of differential transistors connected to said first pair of differential transistors in parallel, a third pair of differential transistors having collectors connected to the emitters of said first and second pairs of differential transistors and a current source connected to the emitters of said third differential transistors.

14. A frequency multiplier according to claim 13, wherein said drive circuit comprises a pair of differential transistors having emitters connected to each other, a pair of load resistors connected respectively to the differential transistors and a current source connected between a node of the emitters of said differential transistors and the ground, and said phase shifter comprises a first phase shift circuit current-driven by one of said differential transistors and a second phase shift circuit current-driven by the other of said differential transistors, said first and second phase shift circuits supply its integrated outputs to the bases of said third pair of differential transistors of said frequency converter, said first phase shift circuit supplies its differentiated output to the base of one of said first pair of differential transistors and that of one of said second pair of differential transistors, said second phase shift circuit supplies its differentiated output to the base of the other of said first pair of differential transistors and that of the other of said second pair of differential transistors.

15. A frequency multiplier according to claim 14, wherein said drive circuit has an additional resistor connected between said load resistors and a power source.

16. A frequency multiplier according to claim 14, wherein said differential transistors are MOSFETs or MESFETs.

17. A frequency multiplier comprising:

a phase shifter having a differentiator and an integrator each including a series circuit of a resistor and a capacitor;

a nonlinear amplifier including a parallel circuit of a load resistor and a current source and having an output impedance larger than an input impedance of said phase shifter to current-drive said phase shifter; and a frequency converter configured to perform a frequency conversion by multiplying an output signal of the integrator by an output signal of the differentiator of said phase shifter.

* * * * *